(12) United States Patent
Amin et al.

(10) Patent No.: US 11,097,514 B2
(45) Date of Patent: Aug. 24, 2021

(54) METHOD OF IMPROVING OPTICAL QUALITY OF CURVED GLASS STRUCTURES

(71) Applicant: Corning Incorporated, Corning, NY (US)

(72) Inventors: Jaymin Amin, Corning, NY (US); Patrick Joseph Cimo, Corning, NY (US); Thierry Luc Alain Dannoux, Avon (FR); Vladislav Yuryevich Golyatin, Avon (FR); Santona Pal, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 15/310,259

(22) PCT Filed: May 11, 2015

(86) PCT No.: PCT/US2015/030106
§ 371 (c)(1),
(2) Date: Nov. 10, 2016

(87) PCT Pub. No.: WO2015/175385
PCT Pub. Date: Nov. 19, 2015

(65) Prior Publication Data
US 2017/0266925 A1    Sep. 21, 2017

Related U.S. Application Data

(60) Provisional application No. 61/991,887, filed on May 12, 2014.

(51) Int. Cl.
*B32B 17/10* (2006.01)
*B32B 17/06* (2006.01)
(Continued)

(52) U.S. Cl.
CPC .......... *B32B 17/10064* (2013.01); *B32B 1/08* (2013.01); *B32B 3/263* (2013.01);
(Continued)

(58) Field of Classification Search
CPC ........ G06F 1/16–1/1698; G02F 1/133–1/1397
See application file for complete search history.

(56) References Cited

U.S. PATENT DOCUMENTS

| | | | |
|---|---|---|---|
| 3,410,673 A | 11/1968 | Marusak | |
| 7,918,019 B2 * | 4/2011 | Chang | G06F 3/0416 156/247 |

(Continued)

FOREIGN PATENT DOCUMENTS

| | | |
|---|---|---|
| CN | 102143810 A | 8/2011 |
| JP | 3204616 A | 9/1991 |

(Continued)

OTHER PUBLICATIONS

Wood, R.W. "The Invisibility of Transparent Optics". Phys. Rev. (Series I), 15, (1902); pp. 123-124.*

(Continued)

*Primary Examiner* — Prashant J Khatri

(57) ABSTRACT

Shaped glass structures, in particular to curved glass structures, having optically improved transmittance are provided along with methods of making such glass structures. Articles and methods described herein mask tube or reforming defects with help of refractive index-matching substances (e.g. optically clear adhesives) and/or additional glass layers. The articles and methods are applicable to any shaped glass, and is particularly useful for 3D-shaped parts for use in portable electronic devices.

11 Claims, 6 Drawing Sheets

(51) Int. Cl.

| | | |
|---|---|---|
| *B32B 7/023* | (2019.01) | |
| *B32B 1/08* | (2006.01) | |
| *B32B 3/26* | (2006.01) | |
| *H05K 5/00* | (2006.01) | |
| *H05K 5/03* | (2006.01) | |
| *G06F 1/16* | (2006.01) | |
| *H04M 1/02* | (2006.01) | |

(52) U.S. Cl.
CPC ............ *B32B 7/023* (2019.01); *B32B 17/064* (2013.01); *B32B 17/10091* (2013.01); *B32B 17/10137* (2013.01); *H05K 5/0017* (2013.01); *H05K 5/03* (2013.01); *B32B 2307/418* (2013.01); *B32B 2457/202* (2013.01); *G06F 1/1626* (2013.01); *G06F 2200/1634* (2013.01); *H04M 1/0202* (2013.01)

(56) References Cited

U.S. PATENT DOCUMENTS

| | | | |
|---|---|---|---|
| 8,561,429 | B2 | 10/2013 | Allan et al. |
| 9,134,842 | B2 | 9/2015 | Li |
| 9,314,842 | B2 | 4/2016 | Micklash, II et al. |
| 9,725,359 | B2 | 8/2017 | Weber |
| 10,216,026 | B2 | 2/2019 | Shinya et al. |
| 2010/0197187 | A1 | 8/2010 | Naraba et al. |
| 2012/0069517 | A1 | 3/2012 | Prest et al. |
| 2012/0236526 | A1* | 9/2012 | Weber .................. C03C 21/002 361/807 |
| 2013/0050628 | A1 | 2/2013 | Takano et al. |
| 2013/0076612 | A1 | 3/2013 | Myers |
| 2013/0189486 | A1* | 7/2013 | Wang ..................... C03C 3/095 428/141 |
| 2013/0284350 | A1 | 10/2013 | Ishii et al. |
| 2014/0000747 | A1 | 1/2014 | Lasarov et al. |
| 2014/0098472 | A1 | 4/2014 | Zhang |
| 2014/0248817 | A1 | 9/2014 | Noma et al. |
| 2015/0351272 | A1* | 12/2015 | Wildner .............. H01L 27/3244 361/679.21 |

FOREIGN PATENT DOCUMENTS

| | | |
|---|---|---|
| JP | 2011037685 A | 2/2011 |
| JP | 2014001090 A | 1/2014 |
| WO | 2014055496 A1 | 4/2014 |
| WO | WO-2014096199 A1 * | 6/2014 ........... H05K 5/0217 |
| WO | 201636928 | 3/2016 |
| WO | 201640399 | 3/2016 |
| WO | 201640399 A1 | 3/2016 |
| WO | 2016123059 | 8/2016 |
| WO | 2016123315 | 8/2016 |

OTHER PUBLICATIONS

"Displaybank Special Report: Apple Touch Sensor Panel (TSP) Key Technology—GG (DITO & SITO) Abstract". Displaybank, (2012).*

Akilian, "Methods of Improving the Surface Flatness of Thin Glass Sheets and Silicon Wafers" Massachusetts Institute of Technology, Sep. 2008, 298 Pages.

English Translation of CN2015800294953 Search Report, dated Feb. 27, 2018, Chinese Patent Office.

International Search Report and Written Opinion of the International Searching Authority; PCT/US2015/030106; dated Sep. 23, 2015; 9 Pages; European Patent Office.

English Translation of JP2016567636 Office Action dated Mar. 20, 2019; 5 Pages; Japanese Patent Office.

* cited by examiner

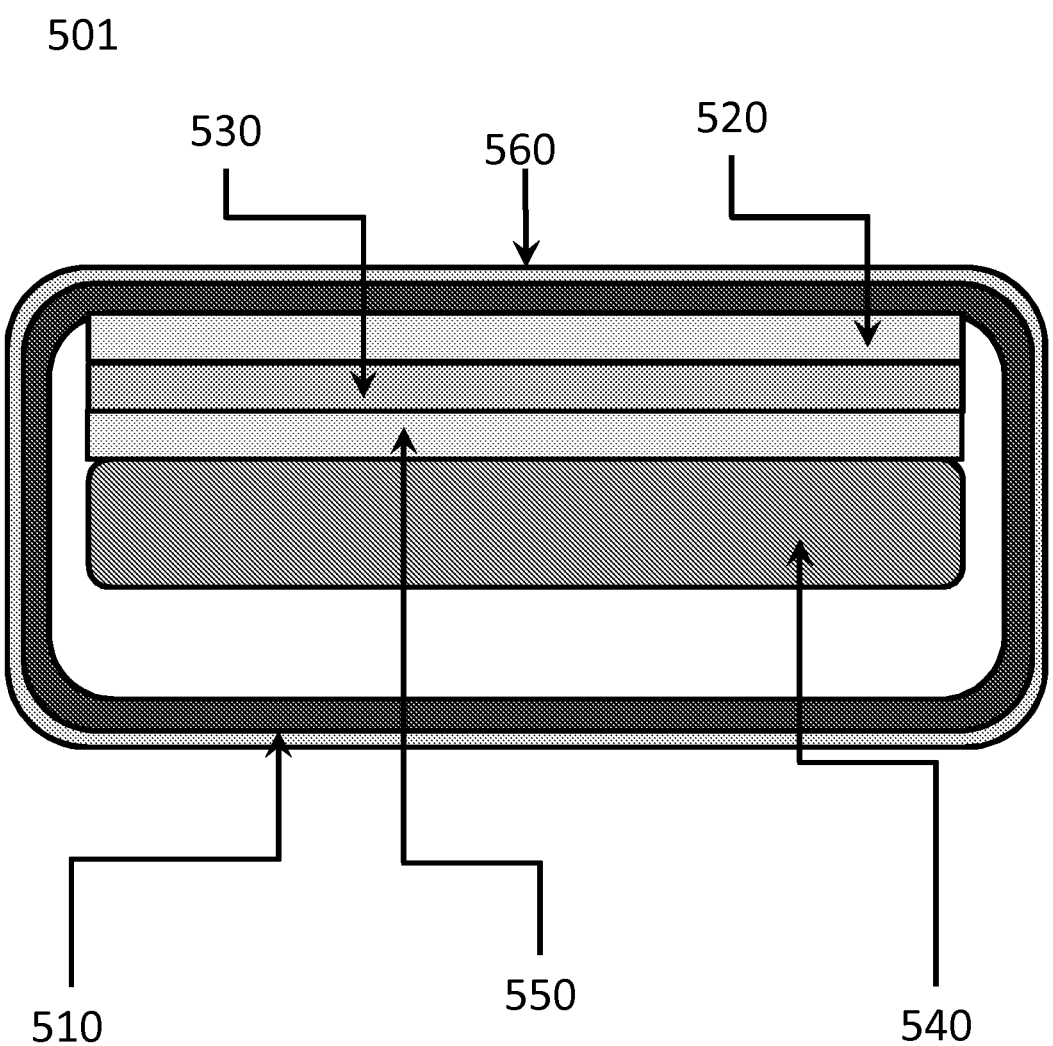

METHOD OF IMPROVING OPTICAL QUALITY OF CURVED GLASS STRUCTURES

This application claims the benefit of priority under 35 U.S.C. § 371 of International Application No. PCT/US2015/30106, filed on May 11, 2015, which claims the benefit of priority under 35 U.S.C. § 119 of U.S. Provisional Application Ser. No. 61/991,887 filed on May 12, 2014 the content of which is relied upon and incorporated herein by reference in its entirety.

FIELD

The present disclosure relates methods of making defect-free glass structures, and in particular to making curved glass structures that have near optical-quality to optical-quality surfaces.

BACKGROUND ART

There is a continued demand in a variety of consumer products for glass structures that have high optical quality and precise shape along with the strength that an thermally- or chemically tempered glass, such as Gorilla Glass®, provides. Tubular glass shapes with circular or non-circular, such as oval or square, cross sections are of particular interest as they have applications in a number of fields, for example as the exterior structure of electronic devices, such as telephones, electronic pads or other handhelds.

Glass quality is an essential attribute of such articles. In such applications, the glass must not only appear flawless, but must also provide no distortion of the image transmitted from display and no uneven distortion of objects reflected from the glass surface. In general, such a high level of optical quality for a 3D shaped glass can only be achieved through expensive and time-consuming polishing processes. However, polishing of noncircular designs is particularly difficult due to the limited and asymmetric access to the internal surfaces.

Presently, various tube reforming processes are being used or considered for achieving required shapes. These approaches present significant challenges for reaching the necessary cosmetic requirements. First, the vast majority of commercially available tubes present an optical defect called 'paneling'—an appearance of stripes or striations that run parallel to the tube direction. While not always noticeable in tube form, they become particularly apparent to a naked eye in a more flattened oval or squared cross section (a "sleeve") form and/or when the glass is used as a display. Second, such reforming processes rely on contact of some sort of tooling with glass at viscosities around the glass softening point. At these viscosities any contact is most often detrimental to the surface quality leading to nanometer to a micron scale surface distortions, imperfections or other variations that apparent to a human eye. The present disclosure offers a solution of the outlined problems, by masking tube or reforming defects with help of optically clear adhesives.

SUMMARY

Additional features and advantages of the disclosure are set forth in the detailed description that follows, and in part will be readily apparent to those skilled in the art from that description or recognized by practicing the disclosure as described herein, including the detailed description that follows, the claims, and the appended drawings.

The claims as well as the Abstract are incorporated into and constitute part of the Detailed Description set forth below.

All publications, articles, patents, published patent applications and the like cited herein are incorporated by reference herein in their entirety.

The present disclosure describes a method of improving optical quality of glass articles used for consumer products by masking glass surface defects with help of refractive index matching substances (e.g. optically clear adhesives). The method is applicable to any shaped glass, and is particularly useful for 3D-shaped parts, and most importantly for tubes and sleeves.

The most clear example of the invention is usage of index matching optically clear adhesive ("OCA") to direct bond the display to the internal surface of sleeve glass enclosure. Combing it with external polishing of sleeve this enables achieving superior optical quality of the devise despite presence of surface defects introduced during sleeve production.

Multiple approaches or their combination can be used to hide surface imperfections of a cover glass including direct bonding of a display; direct bonding of glass with high quality surface (e.g. Willow); laminating an index matching OCA film; or one side polishing combined with any of the above.

BRIEF DESCRIPTION OF THE DRAWINGS

FIGS. 5A and 5B show not-to-scale designs of aspects of the glass sleeves described herein. FIG. 5A shows the first aspect, wherein the sleeve structure comprises an index-matching material and an electronic device. FIG. 5B shows the second aspect, wherein the sleeve structure comprises optional index-matching materials, a second glass sheet, and an electronic device.

Figure 1:
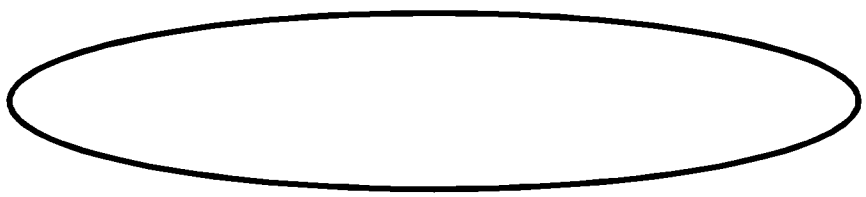
FIG. 1 provides examples of cross sections of "sleeves" or noncircular tubular structures that are embodied herein.
Figure 1:
Figure 1:
Figure 1:
Figure 1:

Cartesian coordinates are shown in certain of the Figures for the sake of reference and are not intended as limiting with respect to direction or orientation.

DETAILED DESCRIPTION

The present disclosure can be understood more readily by reference to the following detailed description, drawings, examples, and claims, and their previous and following description. However, before the present compositions, articles, devices, and methods are disclosed and described, it is to be understood that this disclosure is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the disclosure is provided as an enabling teaching of the disclosure in its currently known embodiments. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein.

Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and/or C; D, E, and/or F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and/or C; D, E, and/or F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

As noted above, the present disclosure is directed to methods of making defect-free glass structures, and in particular to making curved glass structures that have near optical-quality to optical-quality surfaces are provided. Methods described herein mask tube or reforming defects with help of refractive index matching substances (e.g. optically clear adhesives) or additional glass layers. The method is applicable to any shaped glass, and is particularly useful for 3D-shaped parts, and most importantly for tubes and sleeves. The methods described provide the following advantages: improved optical quality of a consumer products with glass a cover; elimination of internal polishing step for the device assembly; enabling shapes where internal polishing is impossible or impractical, e.g. sleeve shapes; enabling higher throughput, more cost effective or higher precision forming methods of making 3D shaped cover glass. For example, forming approaches where internal glass surface is touched by tooling at low viscosity and therefor causing surface degradation; in the particular case of tube reforming, enabling conventional tubes without superior surface quality to be used as a feedstock; and enabling larger display area or smaller bezel size of a consumer electronics device.

As used herein, the term "sleeve" describes a three-dimensional, tubular glass substrate having a non-circular cross section. Generally, a sleeve will be somewhat oval in shape or somewhat rectangular in shape, wherein the edges are rounded. In some embodiments, the sleeve will have at least one face that is near optically or optically flat. FIG. 1 shows non-limiting examples of cross sections of sleeves as used herein. The sleeve may generally be composed of any glass composition that is capable of being formed into the structure. In particular, borosilicates, alkali aluminosilicates, and other composition that can be fusion drawn or pulled into tubes are of particular relevance. The sleeves ideally have a thickness from about 0.3 mm to about 2.0 mm. In some embodiments, the thickness of the tubes is constant, while in other embodiments, the tubes may be thicker at key points, for example on the narrow sides as shown in U.S. application Ser. No. 13/832,769, herein incorporated by reference in its entirety.

The glasses used in the sleeves described herein can be tempered. While other glass compositions can be used, alkali aluminosilicates have the added ability to be both thermally and chemically tempered. Chemical tempering, or ion exchange, is well known in the art—e.g., U.S. Pat. Nos. 3,410,673 and 8,561,429, both of which are herein incorporated by reference in their entireties. The sleeves herein are ideally tempered to give the glass the added strength benefit for use of the sleeves in portable electronic applications.

While most of the embodiments herein are used particularly in application to sleeve glass enclosures, it is contemplated that the same method could be applied more widely, for example with the additional step of cutting the tubes in half to provide for 3D shaped cover glass parts.

Figure 2:
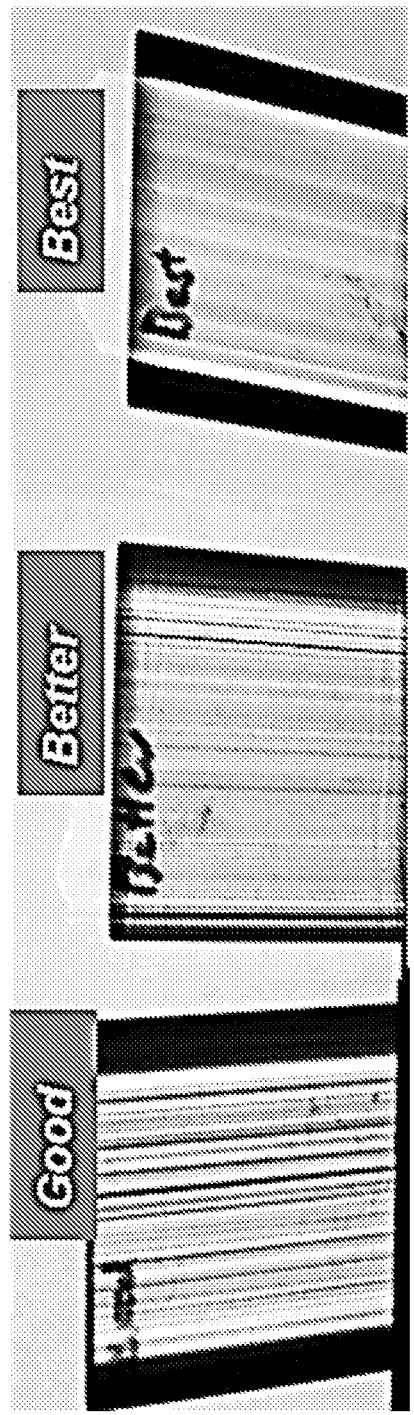
FIG. 2 is shows a xenon light shadowgraph illustrating "paneling" defects present on the vast majority of commercially-available glass tubes.

Current tube reforming processes are being used or considered to try to achieve the required sleeve shapes for high end applications. However, these approaches present significant challenges for reaching cosmetics targets. First, the vast majority of commercially available tubes present an optical defect called 'paneling'—an appearance of stripes or striations that run parallel to the tube direction (FIG. 2). While not always noticeable in tube form, they become particularly apparent to a naked eye in a sleeve form and/or when the glass is used as a display. Second, such reforming processes rely on contact of some sort of tooling with glass at viscosities around the glass softening point. At these viscosities any contact is most often detrimental to the surface quality leading to nanometer to a micron scale surface distortions, imperfections or other variations that apparent to a human eye. The present disclosure offers a novel solution to the outlined problems by masking tube or reforming defects with help of optically clear adhesives.

In the past, surface polishing has generally been used to eliminate these type of defects. However, polishing of noncircular designs is particularly difficult due to the limited and asymmetric access to the internal surfaces.

One of the principle ways used to analyze the surface quality of the glass tubing is through shadowgraphy. Shadowgraphy is an analytical method wherein a bright light is passed through the tubing and the glass's shadow is analyzed for imperfections and/or paneling defects. While shadowgraphy does not have direct correlation with glass optical performance in a particular product, it is a very useful tool for highlighting the differences in optical quality because it is particularly good at enhancing the ability to detect even small imperfections in the glass. Thus, it can be used as a surrogate method to demonstrate improvements provided by embodiments described herein.

Figure 5A:
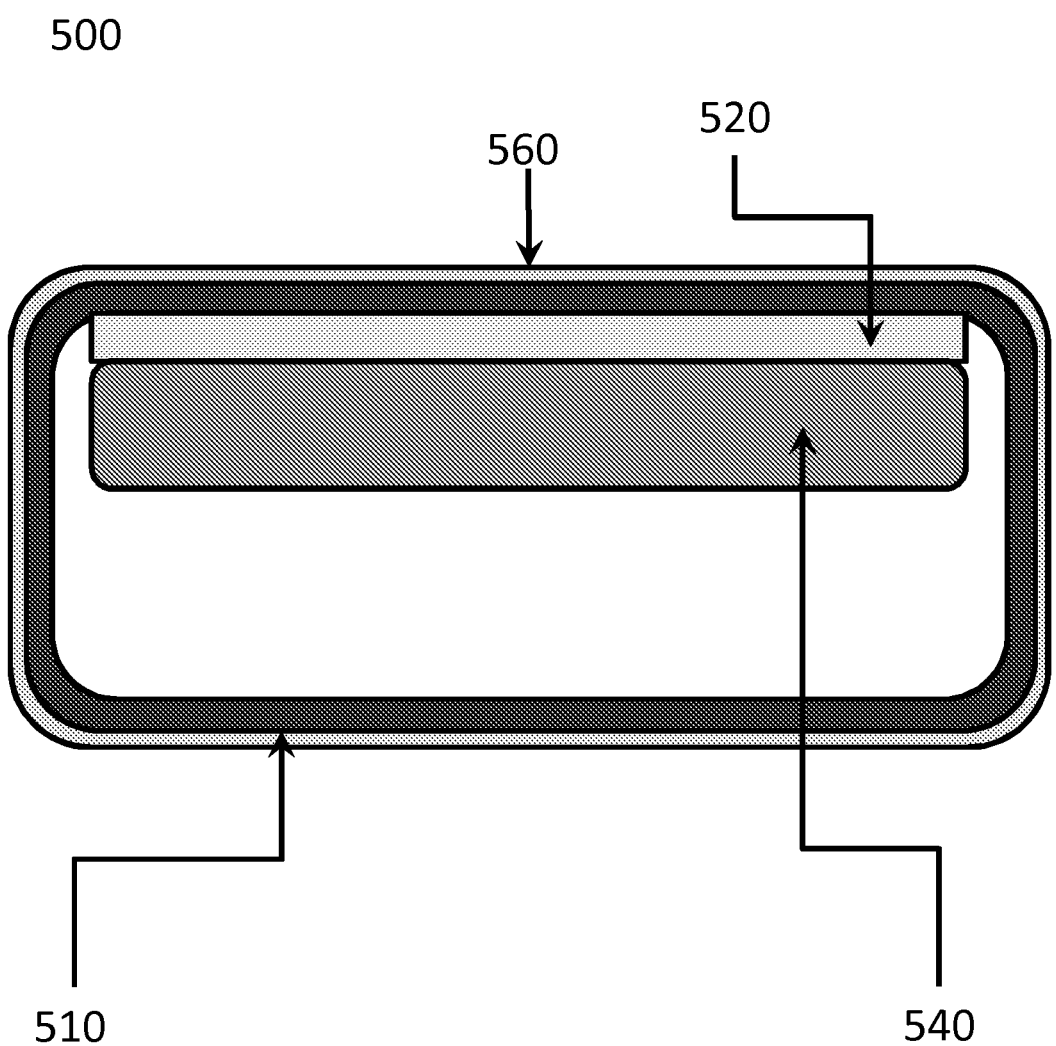

A first aspect, an example embodiment of which shown as 500 in FIG. 5A, comprises combining the tubular glass structure (or "sleeve"), 510, with an index-matching material or coating, 520, wherein the index-matched coating is located on the interior of the tubular glass structure, and, optionally, one or more electronic components, 540, located within both the sleeve and the index-matched material. The index-matching material 520 is a substance, usually a polymer, liquid, cement, adhesive, or gel, which has an index of refraction that closely approximates that of the sleeve 510. In some embodiments, the index-matching material 520 has an index of refraction that within ±25%, ±20%, ±15%, ±10%, ±5%, or ±2.5% of the index of refraction of the sleeve. In particular, some embodiments have an index-matching material 520 that has an index of refraction that is within ±10% or ±5% of the index of refraction of the tubular glass structure 510.

A second aspect, an example embodiment of which shown as 501 in FIG. 5B, comprises the tubular glass sleeve 510 with a second, interior glass layer, 530, comprising a high quality flat or flexible glass inside the sleeve, optionally, one or more index-matching materials or coatings, 520 and 550, and, optionally, one or more electronic components, 540, located within both glasses and the optional index-matched material. In such embodiments, the interior glass 530 can be designed to contact the interior of the sleeve 510 in particular regions, such as along long or flat regions, or if made of a highly flexible, thin glass, such as Corning Willow® glass, may be designed to contact the entire interior of the sleeve 510. The sleeve 510 and interior glass 530 may be laminated together or direct bonded with an adhesive, which may be the index-matching material. In cases where the glasses are laminated, an adhesive 520 may be present between the glasses, which may be the index-matching material 520. Alternatively, the glasses may be laminated together through heating or other processes. In the case of bonding, the two glasses may be combined with an adhesive or a combination of adhesives that are index matched or work in combination with the index-matching material or coating.

When an interior glass 530 is present, the index-matching material 520 and/or 550 may be present between the sleeve 510 and the interior glass ($M_{sg}$), between the interior glass 530 and optional electronic device 540 within the sleeve ($M_{gd}$) (when present), or both. When present between both, the index-matching materials 520 and 550 may be the same or different, depending on the refractive indices of the various components. In some embodiments, the index of refraction of index-matching material $M_{sg}$ is within ±10% or ±5% of the index of refraction of the sleeve. In some embodiments, the index of refraction of index-matching material $M_{sg}$ is within ±10% or ±5% of the index of refraction of the interior glass. In some embodiments, the index of refraction of index-matching material $M_{sg}$ is within ±10% or ±5% of the average of the index of refraction of the sleeve and the interior glass. In some embodiments, the index of refraction of index-matching material $M_{gd}$ is within ±10% or ±5% of the index of refraction of the interior glass 530. In some embodiments, the index of refraction of index-matching material $M_{gd}$ is within ±10% or ±5% of the index of refraction of the electronic device's display glass. In some embodiments, the index of refraction of index-matching material $M_{gd}$ is within ±10% or ±5% of the average of the index of refraction of the interior glass and the electronic device's display glass.

In addition to the index-matching aspect of coating, in some embodiments, the index-matching material 520 and/or 550 comprises a substance that has additional beneficial properties. For example, the index-matching material 520 and/or 550 may act as a laminating layer that directly or indirectly increases the strength of the sleeve 510 and/or prevents the sleeve 510 from shattering or coming apart when exposed to damage. In some embodiments, the index-matching material 520 and/or 550 may act as a cushioning or protective layer for any electronic components 540 within the sleeve 510. This can help to prevent the electronic components 540 from being damaged when the device 500 or 501 is dropped and, in some cases, also lessen damage to the sleeve 510 by reducing interior stresses.

The index-matching coating 520 and/or 550 may comprise any material that works in the application—meaning, e.g., that not only does the material meet the necessary index of refraction limitations, but also other properties related to, e.g., thermal and photostability, adhesion, strength, transmittance, viscosity, glass transition, and/or color. In particular, UV curable, such as Vitralite 7565 with refractive index of about 1.51, or pressure sensitive adhesives are particularly useful in electronics display applications. The coating can be from about 25 μm or greater, for example, about 25 μm to about 200 μm. In some embodiments, the coating is >75 μm. In some embodiments, the coating is from >75 μm to about 200 μm.

Coatings 520 and/or 550 may be applied via any of the known means that provides an even covering and that works with the structure of the tubular glass structure 510. For example, the coating 520 and/or 550 may be applied via dip coating, spray coating, spin coating, blading, brushing, vapor deposition, printing processes, or roll-to-roll processes. The coating 520 and/or 550 may be applied to the sleeve 510 prior to insertion of any electronics 540, applied to the electronics 540, which are then inserted into the sleeve 510, or may be applied to the electronic device 500 or 501 after the electronics 540 have been placed within the sleeve 510 (for example, via an injection process).

Regarding the second, interior glass 530, it should be a high quality glass substrate having a refractive index similar to the sleeve 510. In some embodiments, the interior glass 530 has an index of refraction that within ±25%, ±20%, ±15%, ±10%, ±5%, or ±2.5% of the index of refraction of the sleeve. In particular, some embodiments have an interior glass 530 that has an index of refraction that is within ±10% or ±5% of the index of refraction of the tubular glass structure 510.

The interior glass 530 thickness is ideally thin to prevent the glass from occupying the limited space within the sleeve, minimize optical distortion and allow for flexibility. In embodiments, the interior glass 530 can have a thickness from about 30 μm (microns) to about 0.7 mm. At the lower end of the thickness range—from about 30 μm to about 200 μm, the glass 530 is flexible enough to be "wrapped" around the entire interior of the sleeve. Glass products that could be used in such a manner include Corning's WILLOW® glass.

The interior glass 530 may be made from any glass composition and via any process that meets the desired optical quality. Non-alkali containing glass compositions used in electronic display applications are particularly suited to this application—for example, Corning's EAGLE® line of display glasses. However, in some embodiments, it may be desirable to have a chemically tempered interior glass. In those circumstances, ion-exchangeable glass substrates may be used, such as Corning's GORILLA® glasses. When using alkali containing glasses, additional barrier layers may be incorporated into the device to prevent ion migration into the electronics. In cases where alkali poisoning is a concern, thermally tempered non-alkali glass may also be used. thickness, optical quality—display IP, willow IP Electronic components 540, such as electronic (LED/LCD) displays and additional components, can be placed inside the tubular glass structure 510 to produce an electronic device 500 or 501. In such embodiments, the index-matching material 520 and/or 550 couples the electronic display 540 to the sleeve 510 to reduce the appearance of paneling and other defects and, in some embodiments, enhance the light output from the display. In addition to the display, other electronic components may be placed in the sleeve 510, on either side of the index-matching material 520 and/or 550, or in some embodiments, within the index-matching material 520 and/or 550. For example, transparent conductive oxides, metal meshes, and other touch-components know to those of skill in the art may be coated onto the sleeve prior to the addition of the index-matching material 520 and/or 550. In some embodiments, waveguide structures may be written into or on the sleeve 510 to give certain touch or optical functionalities, such as shown in U.S. application Ser. No. 14/460,691, herein incorporated by reference in its entirety.

A third aspect comprises the combination of the approaches described above with additional techniques to further improve the perceived surface quality and hide surface imperfections on a sleeve. For example, in both the first and second aspects described above, embodiments may comprise additional steps or components, such as polishing on the exterior or the interior, or additional exterior coatings, 560, such as anti-fingerprint, anti-smudge, scratch resistant, etc. coatings. In some embodiments, the interior is polished where the display will be located to minimize the amount of index-matching material needed. In embodiments where the exterior is polished, it is desirable to obtain a surface on the glass sleeve that has a surface roughness ($R_a$) less than 1 nm and is free of defects having a size larger than 150 μm, 100 μm, or 50 μm.

In embodiments where the sleeve 510 has at least one planar "face" or long side (FIGS. 1 and 5), the face should be very flat and free of distortions to provide an optically attractive surface. The flatness may be obtained by the process used to make the sleeve or by polishing or other post-production processes. In addition to the imperfections described above, the planar section should have a flatness better than ±150 μm over a 10 mm×10 mm area or ±50 μm over a 25 mm×25 mm area as measured by a FlatMaster® tool.

Another aspect contemplates and electronic device 500 or 501 based on the sleeve structures described herein. The electronic device 500 or 501 comprises any of the previous aspects in combination with an electronic display, such as a smartphone, tablet device or other portable electronic device. In such embodiments, the index-matching coating 520 or 550, when present, can bond the glass structure 530 to the electronic device 540 and, as noted previously may be index-matched to the sleeve 510, the interior glass 530, or electronic display 540, or may have a refractive index that is an average of a combination of these. In cases where the interior glass layer 530 is not present, the coating may further adhere the glass structure to the electronic device. As noted above, in embodiments where the second glass substrate 530 is present, there may be one or more additional adhesives or coatings between the second interior glass and the electronic device or display, 550.

As noted above, the devices described herein may be produced via a variety of methods. The sleeve 510 can be produced via a number of process, including by being directly drawn or by modification of previously drawn circular tubing. Example methods can be found in U.S. Prov. Appl. Nos. 62/109,811, 62/107,598, 62/045,114, and 61/991,887, all of which are incorporated by reference in their entireties. The index-matching layer 520 can be placed in the sleeve prior to insertion of the interior glass 530 and/or the electronic device 540 or after, depending on the state of the material (i.e., liquid, solid polymer, etc.). Alternatively, the interior glass 530 and/or the electronic device 540 may be coated with the index-matching layer 520 and placed in the sleeve 510. Similarly, where used, the index-matching layer 550 can be place on either interior glass 530 and/or the electronic device 540, or inserted after placement of the interior glass 530 and/or the electronic device 540. In some embodiments it is useful to use an index-matching layer that is UV curable so that it can be inserted in liquid form to occupy the space between the interior glass 530 and/or the electronic device 540, and then cured to provide a solid state layer. In other embodiments, a polymer tape, such as a pressure-sensitive polymer tape is advantageous due to the ability to use roll-to-roll processing or other means to apply the interior materials to the sleeve—this is particularly true where the interior glass 530 is a flexible thin glass that can be rolled.

EXAMPLES

Prospective Example 1

Usage of an index matching OCA to direct bond the display to the internal surface of sleeve glass enclosure. Combing the display with an externally polished sleeve enables achieving superior optical quality in the devise despite the presence of surface defects introduced during sleeve production. FIGS. 5 and 6 illustrate this example.

Figure 3:
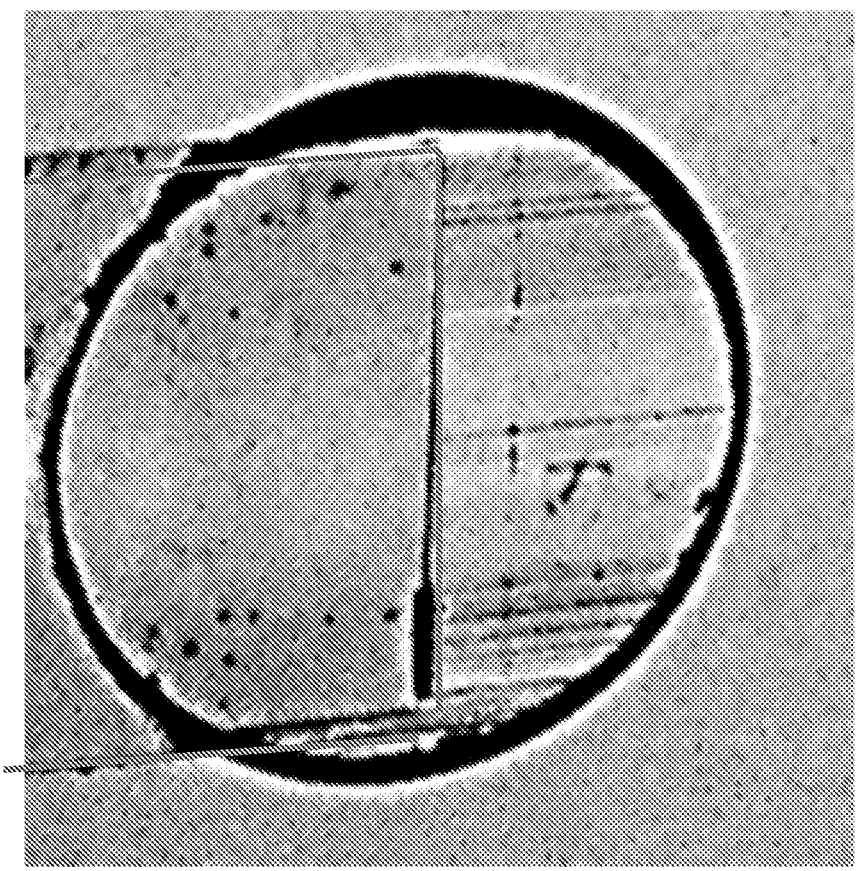
FIG. 3 is a shadowgraph of an externally polished, reformed glass sleeve coupon laminated on the left-hand half with and index matching OCA film (3M 8214®—4 mil) as compared to the unlaminated side (right) showing paneling.
Figure 4:
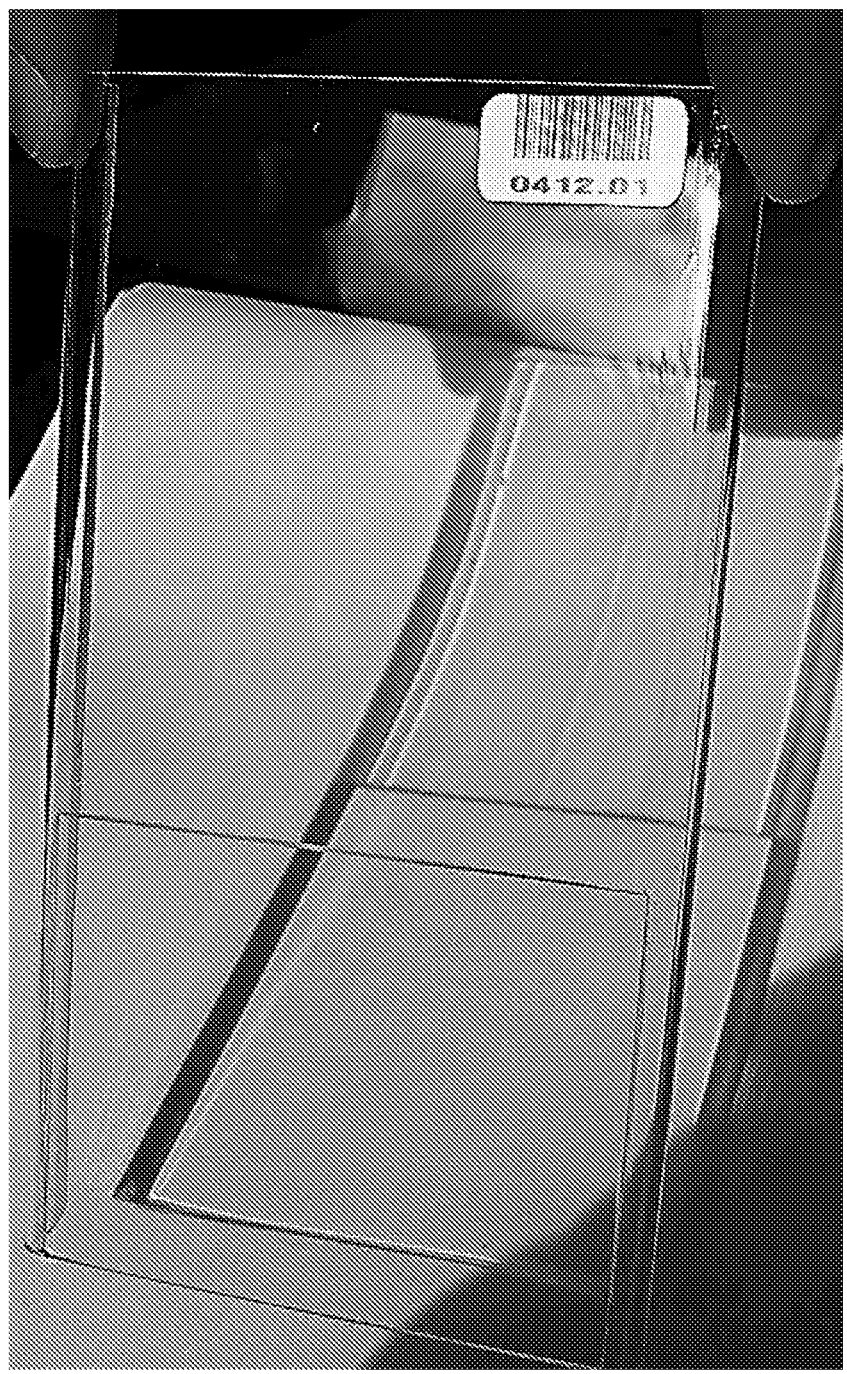
FIG. 4 is a picture of an externally polished glass sleeve part with the back panel removed for the illustration. A piece of 0.5 mm thick EAGLE XG® is glued to the inside of the sleeve (bottom section). A UV curable adhesive, VITRALITE® 7165, with refractive index of 1.51 is used to adhere the glasses together. The shadow from the sunlight highlights the advantages of the combination of glasses and adhesive. Paneling and scratches (tooling marks during internal reforming process) are visible on the bare part, but disappear in the bottom section where the fusion drawn Eagle XG® glass is attached.

In FIGS. 3 and 4, Corning EAGLE XG®—0.1-0.7 mm thick is used to mimic typical LCD display. Pressure sensitive adhesive or UV curable adhesive, such as VITRALITE® 7565 with refractive index of about 1.51, can be used. UV curable adhesive is dispensed on the display, or a front glass such as EXG 0.5 to 0.2 mm thick, in a "h" or "x" pattern helping in corner feeding. Pressing is done via use of an iron-neodymium magnet during UV insulation.

FIG. 5 clearly show the advantage of the present invention illustrating how paneling (FIG. 1) disappear when the method is applied.

Although the embodiments herein have been described with reference to particular aspects and features, it is to be understood that these embodiments are merely illustrative of desired principles and applications. It is therefore to be understood that numerous modifications may be made to the illustrative embodiments and that other arrangements may be devised without departing from the spirit and scope of the appended claims.

What is claimed is:

1. An electronic device comprising:
 a glass sleeve structure having an internal cavity and an unpolished internal surface, a first index of refraction, and a non-circular cross section;
 an electronic device comprising a display, wherein the electronic device is located in the internal cavity of the glass sleeve structure;
 a second glass sheet made of glass between at least part of the glass sleeve structure and the electronic device, disposed on at least part of the interior of the glass sleeve structure, the second glass sheet comprising glass and having a second index of refraction, wherein the second index of refraction is within ±25% of the first index of refraction; and
 a first index-matching material present between and in direct contact with the glass sleeve and the glass of the second glass sheet and, wherein the first index-matching material is disposed on at least part of the interior of the glass sleeve and has a third refractive index, wherein the third refractive index is within ±10% of the first or the second index of refraction, wherein the outer surface of the glass sleeve has a surface roughness (Ra) less than 1 nm.

2. The electronic device of claim 1, wherein the second index of refraction is within ±10% of the first index of refraction and the third refractive index is within ±10% of the first index of refraction.

3. The electronic device of claim 1, wherein the glass sleeve has a thickness from about 0.3 mm to about 2.0 mm.

4. The electronic device of claim 1, wherein the second glass sheet has a thickness from about 30 μm to about 200 μm.

5. The electronic device of claim 1, wherein the glass sleeve has been thermally or chemically tempered.

6. The electronic device of claim 1, wherein the glass sleeve comprises at least one planar surface area spatially coincident with the display.

7. The electronic device of claim 1, wherein the first index-matching material comprises a polymer, liquid, cement, adhesive, or gel.

8. The electronic device of claim 7, wherein the first index-matching material comprises a polymer.

9. The electronic device of claim 1, wherein the outer surface of the glass sleeve is free of defects having a size larger than 150 μm.

10. The electronic device of claim 1, further comprising a second index-matching material present between the second glass sheet and the display, wherein the second index-matching material is different from the first index-matching material.

11. A method of forming the electronic device of claim 1, comprising:
 forming a glass sleeve structure;
 coating:
  a. at least part of the interior of the glass sleeve with an index-matched coating and inserting the optional second glass structure into the glass sleeve; or
  b. at least part of the optional second glass structure with an index-matched coating and inserting the optional second glass structure into the glass sleeve; and
 inserting the electronic device in the cavity of the glass sleeve.

* * * * *